(12) United States Patent
Schaffer

(10) Patent No.: US 6,283,613 B1
(45) Date of Patent: Sep. 4, 2001

(54) LED TRAFFIC LIGHT WITH INDIVIDUAL LED REFLECTORS

(75) Inventor: Irving Schaffer, Fairfield, CT (US)

(73) Assignee: Cooper Technologies Company, Houston, TX (US)

( * ) Notice: Subject to any disclaimer, the term of this patent is extended or adjusted under 35 U.S.C. 154(b) by 0 days.

(21) Appl. No.: 09/362,878

(22) Filed: Jul. 29, 1999

(51) Int. Cl.[7] .................................................. F21V 5/00
(52) U.S. Cl. .................. 362/245; 362/247; 362/800; 362/545; 362/328; 116/63 R
(58) Field of Search .................................... 362/245, 247, 362/800, 554, 545, 328, 329, 339; 116/63 R, 63 P

(56) References Cited

U.S. PATENT DOCUMENTS

| | | | |
|---|---|---|---|
| D. 388,726 | 1/1998 | Wu | D10/115 |
| 3,206,744 * | 9/1965 | Nelson | 116/63 R |
| 4,050,834 | 9/1977 | Lee | 404/16 |
| 4,271,408 * | 6/1981 | Teshima et al. | 340/702 |
| 4,298,869 | 11/1981 | Okuno | 340/782 |
| 4,629,943 | 12/1986 | Ponce, Jr. | 315/200 |
| 4,799,060 | 1/1989 | Brugger | 340/907 |
| 4,903,172 | 2/1990 | Schöniger et al. | 362/31 |
| 4,954,822 | 9/1990 | Borenstein | 340/907 |
| 5,136,287 | 8/1992 | Borenstein | 340/925 |
| 5,174,649 | 12/1992 | Alston | 362/244 |
| 5,327,328 | 7/1994 | Simms et al. | 362/28 |
| 5,343,330 | 8/1994 | Hoffman et al. | 359/708 |
| 5,349,504 | 9/1994 | Simms et al. | 362/32 |
| 5,396,086 | 3/1995 | Engels et al. | 257/99 |
| 5,457,450 | 10/1995 | Deese et al. | 340/912 |
| 5,561,346 | 10/1996 | Byrne | 313/512 |
| 5,580,156 | 12/1996 | Suzuki et al. | |
| 5,612,596 | 3/1997 | Wiese | 315/291 |
| 5,633,629 | 5/1997 | Hochstein | 340/907 |
| 5,636,057 | 6/1997 | Dick et al. | 359/625 |
| 5,640,792 | 6/1997 | Smith et al. | 40/546 |
| 5,663,719 | 9/1997 | Deese et al. | 340/912 |
| 5,715,619 | 2/1998 | Polisois et al. | 40/452 |
| 5,735,492 | 4/1998 | Pace | 246/125 |
| 5,785,418 | 7/1998 | Hochstein | 362/373 |
| 5,833,355 | 11/1998 | You et al. | 362/244 |
| 5,838,247 | 11/1998 | Bladowski | 340/815 |
| 5,850,126 | 12/1998 | Kanbar | 315/200 |
| 6,019,493 * | 2/2000 | Kuo et al. | 362/800 |

FOREIGN PATENT DOCUMENTS

| | | |
|---|---|---|
| 0389724A1 | 10/1990 | (EP) . |
| WO 97/26483 | 7/1997 | (WO) . |

OTHER PUBLICATIONS

Traffic Press Releases Aug. 9, 1998 New Traffic Signals from Dialight Powered by Just 18 LEDS.

Traffic Press Releases New Dialight LED Traffic Signals First to Meet Proposed ITE Spec.

Traffic Press Releases Dialight Offers Cost–Effective Green LED Traffic Signals.

(List continued on next page.)

Primary Examiner—Sandra O'Shea
Assistant Examiner—Bertrand Zeade
(74) Attorney, Agent, or Firm—Fish & Richardson PC

(57) ABSTRACT

An LED signal module includes a casing defining a cavity. Within the cavity is an array of LEDs. Individual reflectors are placed around individual LEDs of the array. The individual reflectors are structured to receive direct light from their associated individual LEDs and substantially to prevent direct light from their associated individual LEDs from impinging upon the individual reflectors of other LEDs of the array of LEDs. Also included, and covering the cavity, is a lens shaped to direct the output luminance of the LEDs below a horizontal axis of the module.

17 Claims, 10 Drawing Sheets

OTHER PUBLICATIONS

Traffic Press Releases Advanced Optical Lensing Enhances LED Signal Efficiency.

Traffic Press Releases Energy–, Space–Efficienct Bi–Modal Arrow From Dialight.

Traffic Press Releases Dialight Offers First Portland Orange LED Signal to Meet ITE Specifications.

DuraLED—Lean, mean and eighteen.

Dialight—Beat the heat.

Dialight—Sure, we know LED signals.

Dialight—Have Your Head Examined.

Dialight—New DuraLED from Dialight.

* cited by examiner

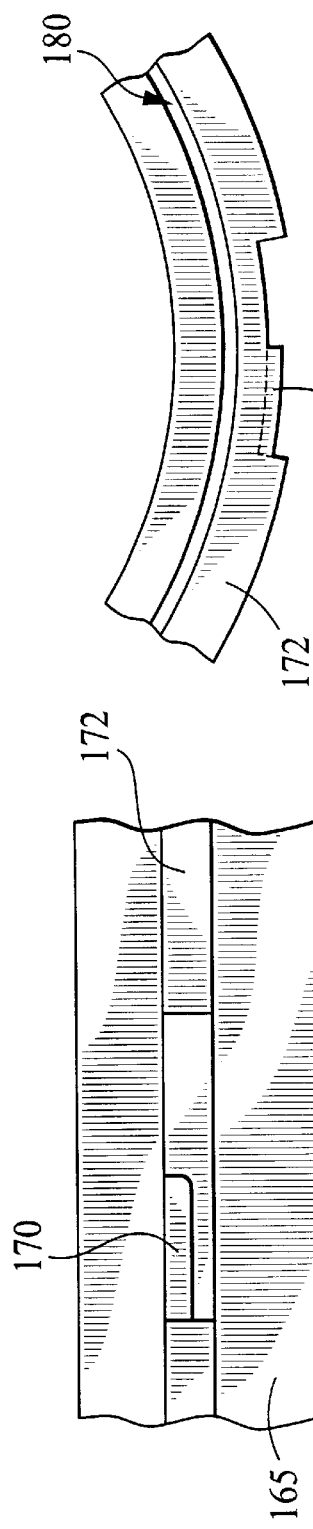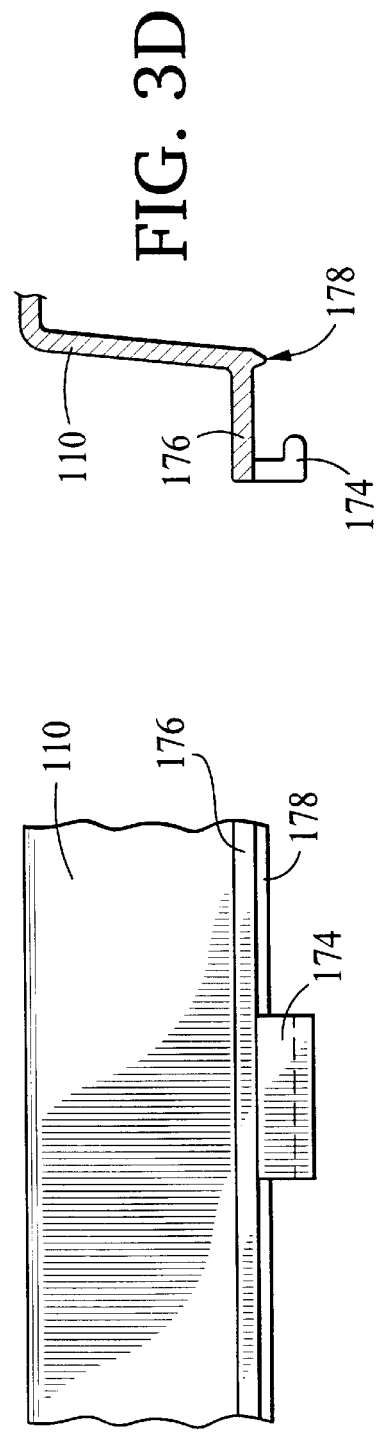
FIG. 3A
FIG. 3B
FIG. 3C
FIG. 3D

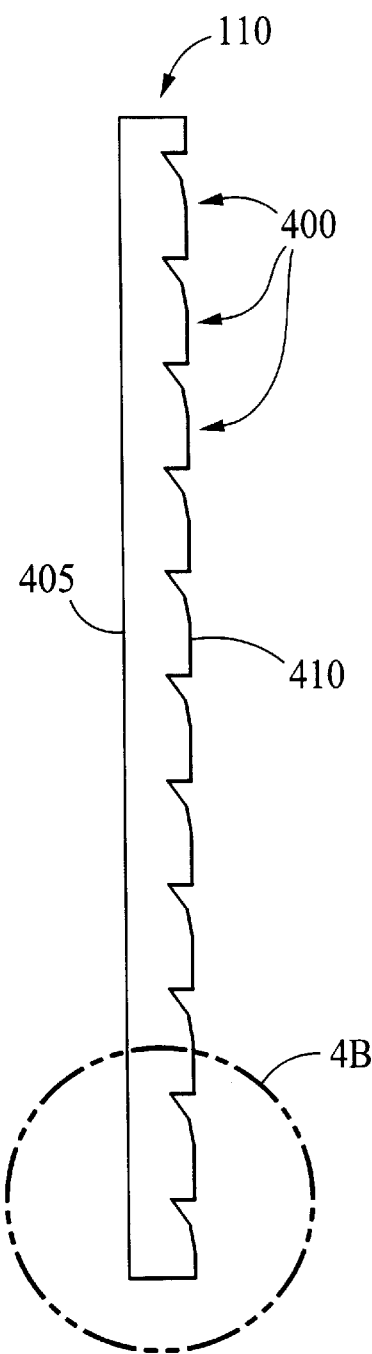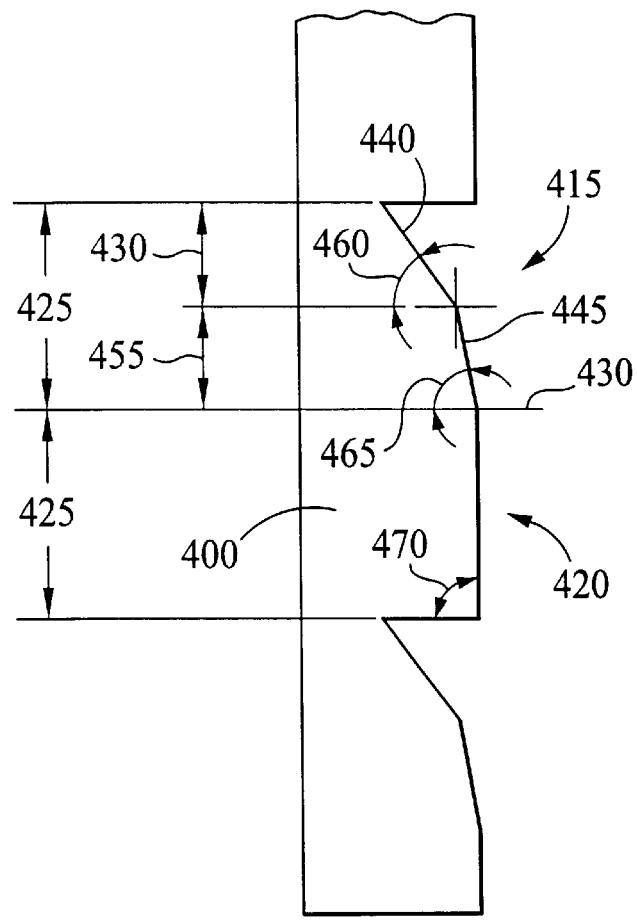
FIG. 4A
FIG. 4B

LED TRAFFIC LIGHT WITH INDIVIDUAL LED REFLECTORS

TECHNICAL FIELD

The invention relates to an LED illuminated traffic signal.

BACKGROUND

Traffic signal lamps or illuminated overhead road signs have conventionally used incandescent lamps for lighting. More recently, efforts have been made to replace the incandescent lamps with light emitting diodes (LEDs). LEDs offer the considerable advantage of consuming significantly less power than incandescent lamps. LEDs also generally require less frequent replacement due to burn out than incandescent lamps. LEDs, in short, offer a desirable reduction in power and maintenance costs as compared to incandescent lamps.

There are, however, several issues to consider when using LEDs in lieu of incandescent lamps for traffic signals and other applications. First, the light emitted from a given LED is of low intensity compared to that of a comparably sized incandescent lamp. Second, conventional LEDs emit light in a relatively tight pattern that requires the redistribution of that light in order to attain spatial distributions in compliance with, for example, Institute of Transportation Engineers (ITE) requirements or other regulations. Also, due to their thermal-sensitivity, heat generated during operation of the LEDs and associated components must be low enough (or adequately dissipated) to assure reliable operation over extreme temperature ranges.

Known implementations of LED signal modules make use of hundreds of individual LEDs to generate light that is sufficient and of satisfactory spatial distribution. The large number of LEDs leads to a more expensive module and one with greater power consumption. The increased power usage leads to greater thermal output, which, if not adequately addressed at additional expense, impacts device reliability.

SUMMARY

An overhead signal module may provide improved illumination qualities through use of LEDs with associated individual reflectors. The individual reflectors provide a substantial increase in the useful luminous output of the signal module relative to a signal module without the reflectors.

The increased efficiency of LEDs coupled with reflectors allows for the use of fewer LEDs in a signal module. This, in turn, leads to lower component cost and reduced power consumption. The reliability of the signal module is also improved due to a reduced part count and a decrease in self-generated thermal energy, which can reduce component life.

A further advantage of this signal module is that it is considerably less prone to the "blink out" effect associated with other LED signals. When viewed from their periphery and off of their optical axis these signals appear to "blink out" due to the tight emission pattern of their LEDs. Multiple individual reflectors increase this signal module's output of anecdotal light, thereby providing a signal more readily visible from the module's periphery.

In one general aspect, an overhead signal module includes a module casing defining a cavity. Positioned within this cavity is a mounting board which carries an array of LEDs. Each LED is equipped with an individual reflector shaped to capture and direct side lobe light of the LED. Mounted parallel to the LED array and covering the cavity is a lens. The lens is shaped to efficiently focus the luminous output of the LEDs below the horizontal plane and to provide the appearance, when viewed from below the horizontal plane, of full uniform illumination.

Embodiments may include one or more of the following features. For example, the reflectors used to gather the side lobe light may be conical. Alternatively, parabolic reflectors may be used. In either case, the reflectors may be formed into an insert assembly which will fit over the LED mounting board and integrate each LED with its corresponding reflector.

The signal module lens may be manufactured of clear polycarbonate and may be either flat or domed. When the lens is clear, the color of the output light will be generated by use of appropriate color LEDs.

The lens may be compound, and may include fresnel lenses positioned to provide each LED with a fresnel lens aligned with the optical axis of the LED. The outer surface of the lens may be smooth, with all of the optical details of the component fresnel lenses on the inner surface of the lens. An advantage of this configuration is that it helps prevent the accumulation of dirt on the lens.

Each fresnel lens may include a two facet upper portion which refracts upward directed light downward below the horizontal axis. The lower portion of the lens may act as a simple window and may be configured to have a neutral effect upon the direction of light propagating through it.

Implementations of the signal module may include an eight-inch diameter and a twelve-inch diameter module. In the case of an eight-inch diameter module, illumination may be provided by 72 LEDs and associated reflectors. A twelve-inch module may include 144 LEDs. In either case, the LEDs are symmetrically distributed in a generally uniform manner.

An individual overhead signal may include a clear lens designed to efficiently redirect light to conform with ITE specifications or other regulations. This lens may be, in turn, a composite of individual fresnel lenses, including one for each LED. Furthermore, each of the LEDs may be provided with its own individual reflector to redirect the LEDs' side lobe light which would otherwise be lost.

Other features and advantages will be apparent from the following description, including the drawings, and from the claims.

BRIEF DESCRIPTION OF THE DRAWINGS

FIGS. 3A and 3B are top and side views of a latching structure of a casing of the module of FIG. 2.

FIGS. 3C and 3D are side and end views of a latching structure of a lens of the module of FIG. 2.

FIG. 4A shows a side view of the lens assembly of the signal module of FIG. 2.

FIG. 4B shows detail B—B of FIG. 4A, illustrating one of the component fresnel lenses.

DETAILED DESCRIPTION

Figure 1:
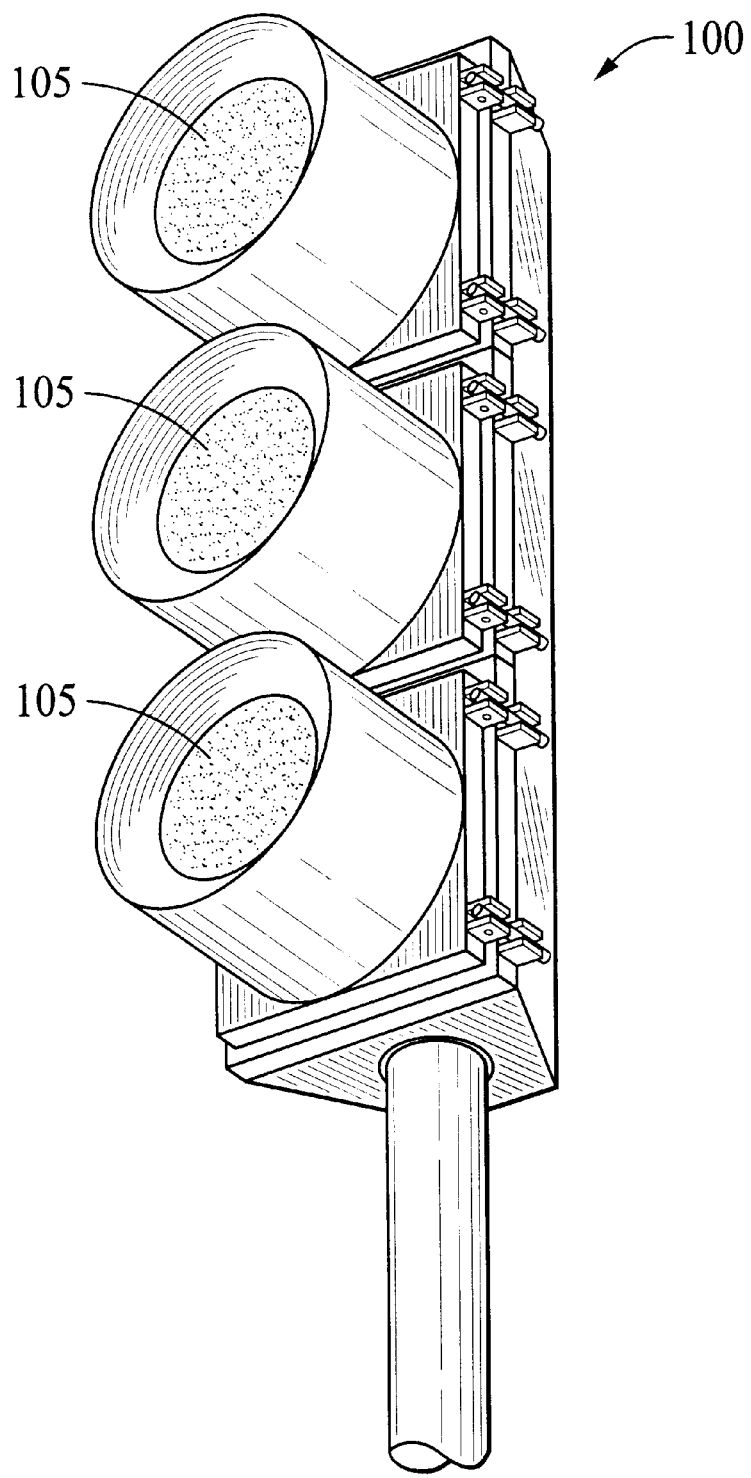
FIG. 1 shows a perspective view of a standard three-light traffic signal.

Referring to FIG. 1, a traffic signal 100 includes three separate LED light modules 105. Each module emits a different color of light, either red, yellow, or green.

Figure 2:
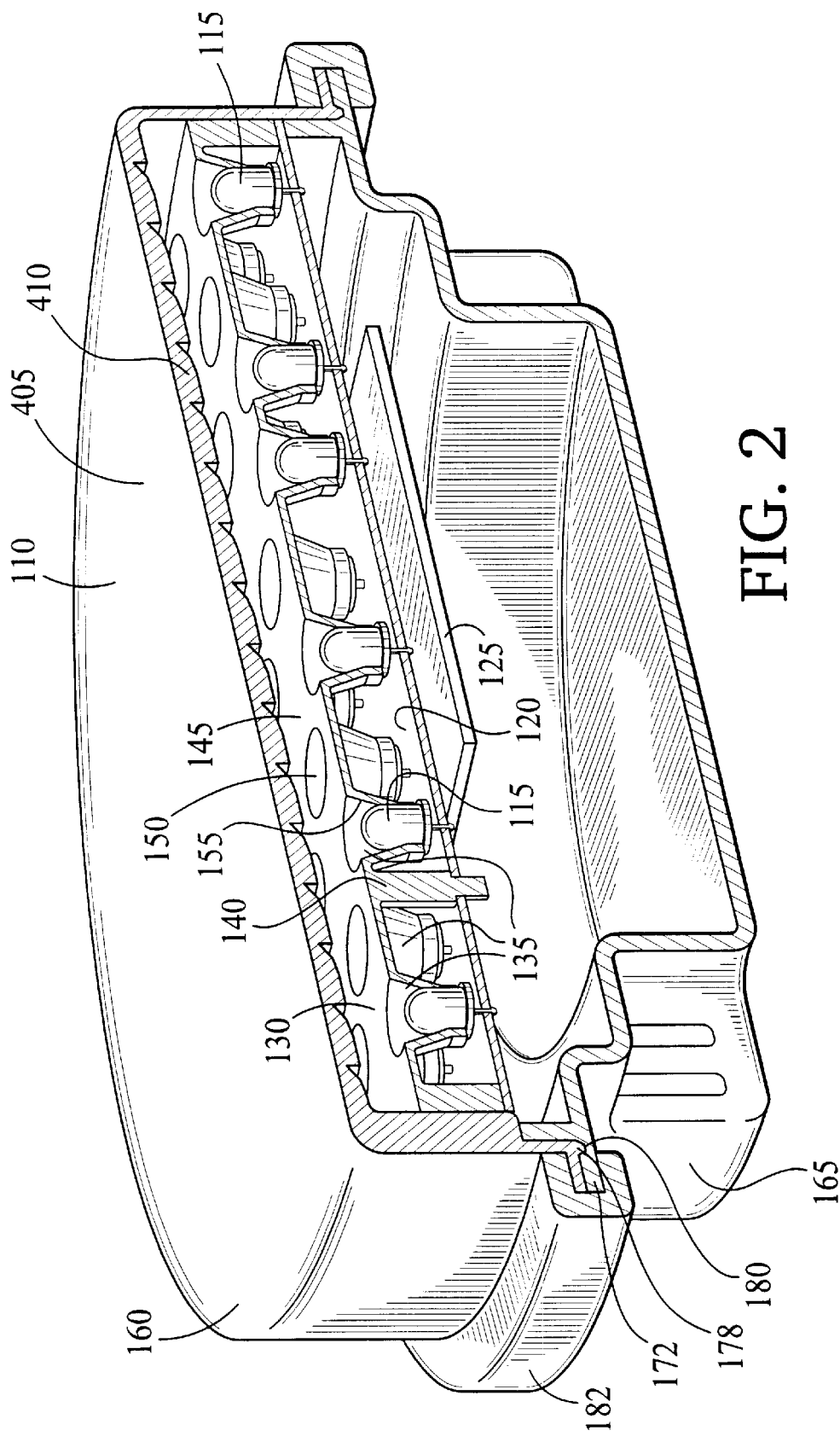
FIG. 2 is a sectional perspective view of an individual signal module of the traffic signal of FIG. 1.

As illustrated by FIG. 2, an LED light module includes a lens 110 and LEDs 115. The LEDs are attached to a mounting board 120 and powered and controlled by a circuit board assembly 125.

A reflector assembly 130 provides an individual reflector 135 for each LED 115 to capture and redirect otherwise dissipated side lobe light of the LED 115. The reflector assembly 130 fits over the LEDs 115, with each LED 115 protruding into an open bottom end of a corresponding reflector 135. The reflector assembly 130 includes a circular upper section 140 having a flat upper surface 145. In general, the surface 145 is black and nonreflective. The reflectors 135 are defined as holes 150 in the surface 145. The reflectors 135 are generally conical and extend from the bottom of the section 140. The inside surfaces 155 of the reflectors 135 are silver and reflective.

The mounting board 120, the circuit board assembly 125, and the reflector assembly 130 are secured in a housing 160 defined by a casing 165 and the lens 110. Referring also to FIGS. 3A–3D, the lens 110 is secured to the casing 165 by a set of interlocking mechanisms. In particular, casing 165 includes a set of tabs 170, one of which is shown in FIGS. 3A and 3B, defined in a rim 172 of the casing. The tabs 170 interact with a set of arms 174, one of which is shown in FIGS. 3C and 3D, that extend from a rim 176 of the lens 110.

A ridge 178 extends from the bottom of the lens 110 along the entire circumference of the lens 110. The ridge 178 mates with a groove 180 defined in the casing 165 to aid in providing a watertight seal between the lens 110 and the casing 165. An annular rubber cover 182 is attached over the interface between the lens 110 and the casing 165 to further enhance this watertight seal.

Referring to FIGS. 4A and 4B, the lens 110 is a planar compound lens including fresnel lenses 400. The lens 110 is preferably formed of clear polycarbonate and includes a smooth exterior surface 405 and an interior surface 410 which provides the optical details of the fresnel lenses 400.

Figure 5:
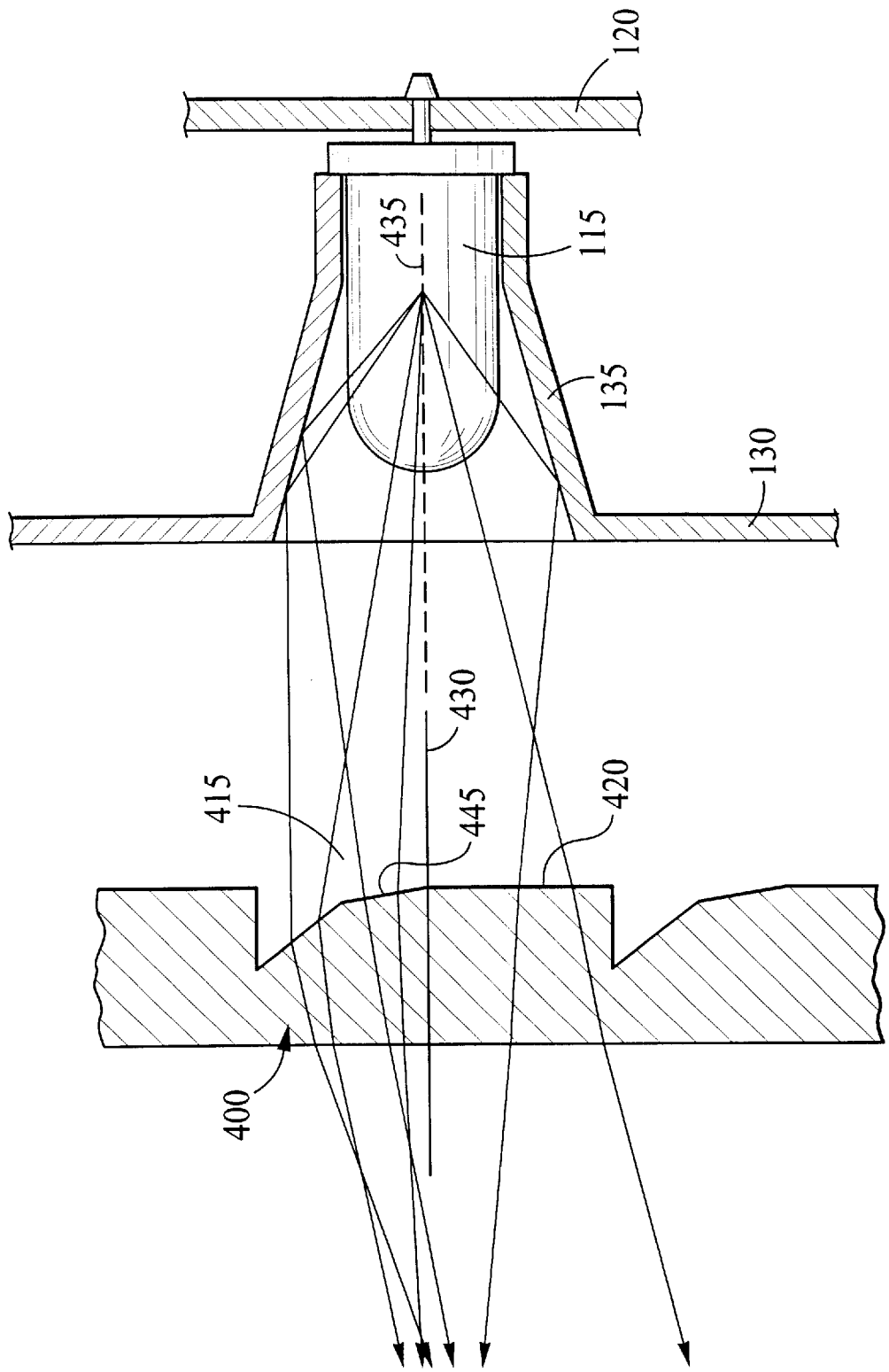
FIG. 5 provides a side view ray diagram showing the redirection of an LED's light by its individual reflector and its corresponding fresnel lens.

The optical details of a fresnel lens 400 are illustrated in the expanded view provided by FIG. 4B. Each fresnel lens includes an upper region 415 and a lower region 420. The upper and lower regions each extend a distance 425. Referring also to FIG. 5, a line 430 separates the upper region 415 and the lower region 420 and lies on the optical axis 435 of an LED 115. Upper region 415 includes, in turn, two linear planar regions 440, 445. The upper of these regions, region 440, extends for a distance 450, while the lower region 445 extends for a distance 455. Region 440 forms, for example, a 64.75 degree angle 460 with the vertical axis, while region 445 forms, for example, a 78.75 degree angle 465 with the vertical axis. These angles are selected to refract upward headed light downward below the horizontal axis. Additionally, the lower region 420 is at an angle of, for example, 85.75 degrees with the vertical axis in order to provide a slight downward modification to the direction of light propagating through it.

Figure 7:
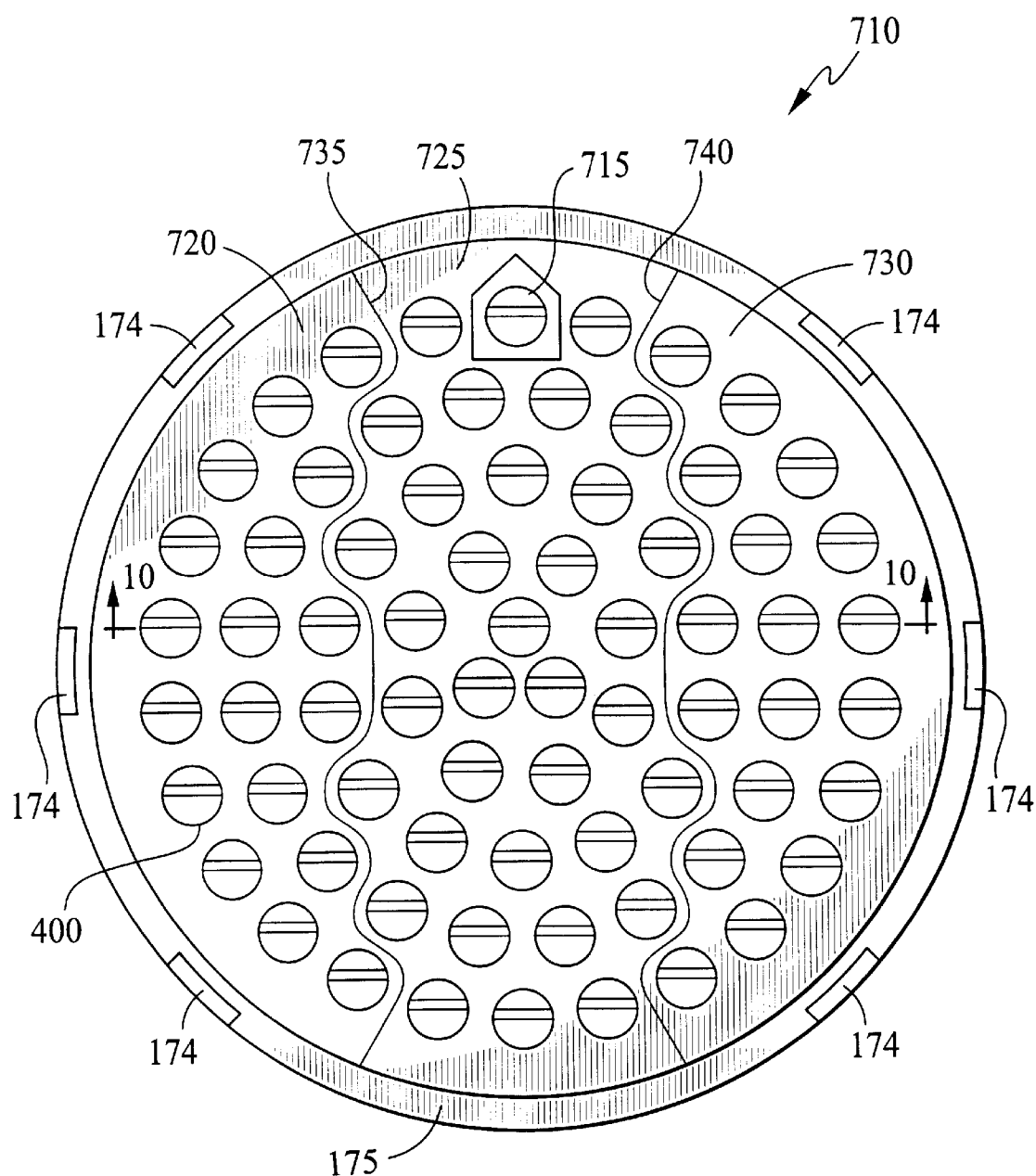
FIG. 7 shows a front view of the lens for the eight inch signal and the corresponding distribution of the fresnel lenses which compose it.
Figure 9:
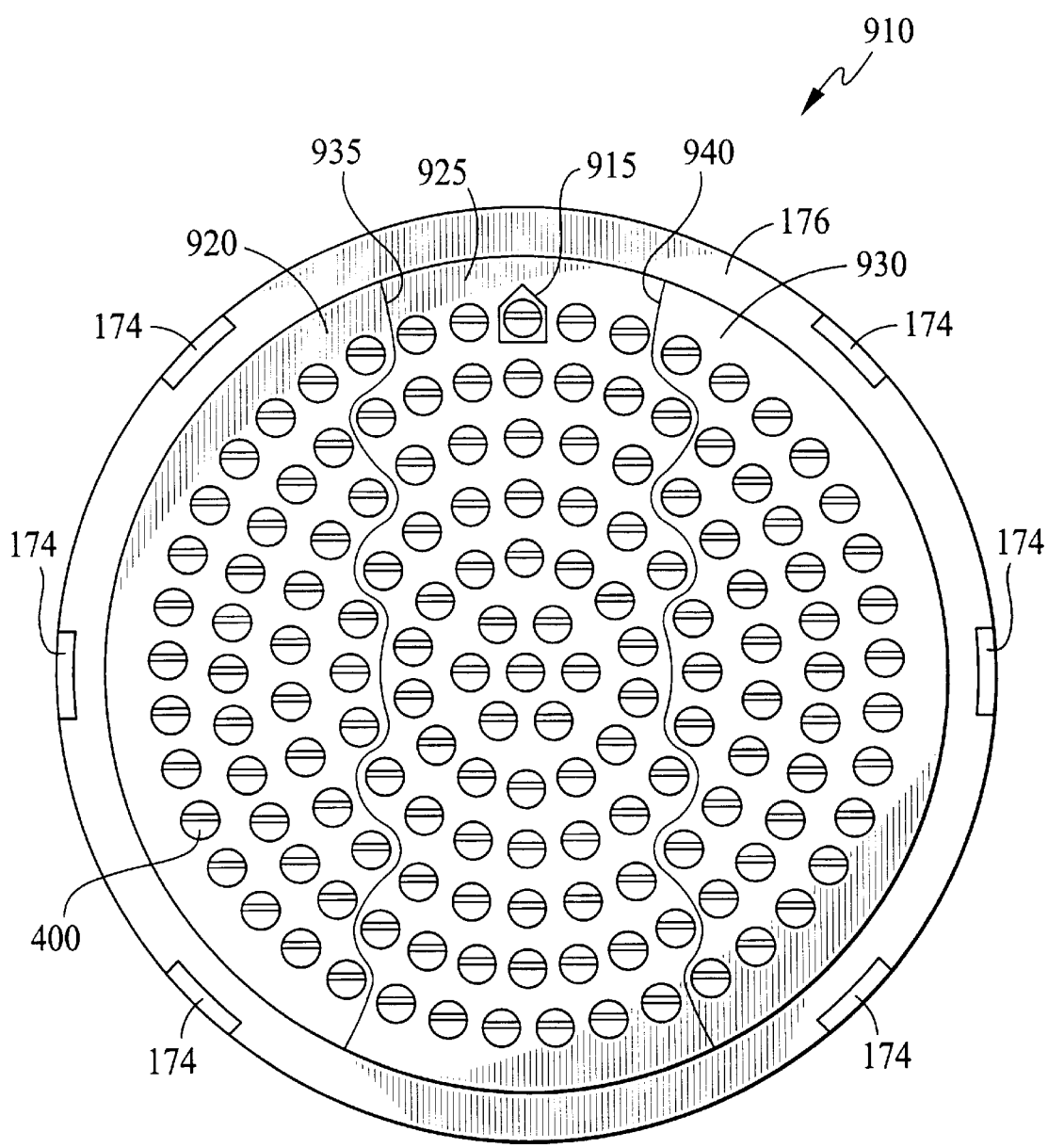
FIG. 9 shows a front view of the lens for the twelve inch signal and the corresponding distribution of the fresnel lenses which compose it.
Figure 10:
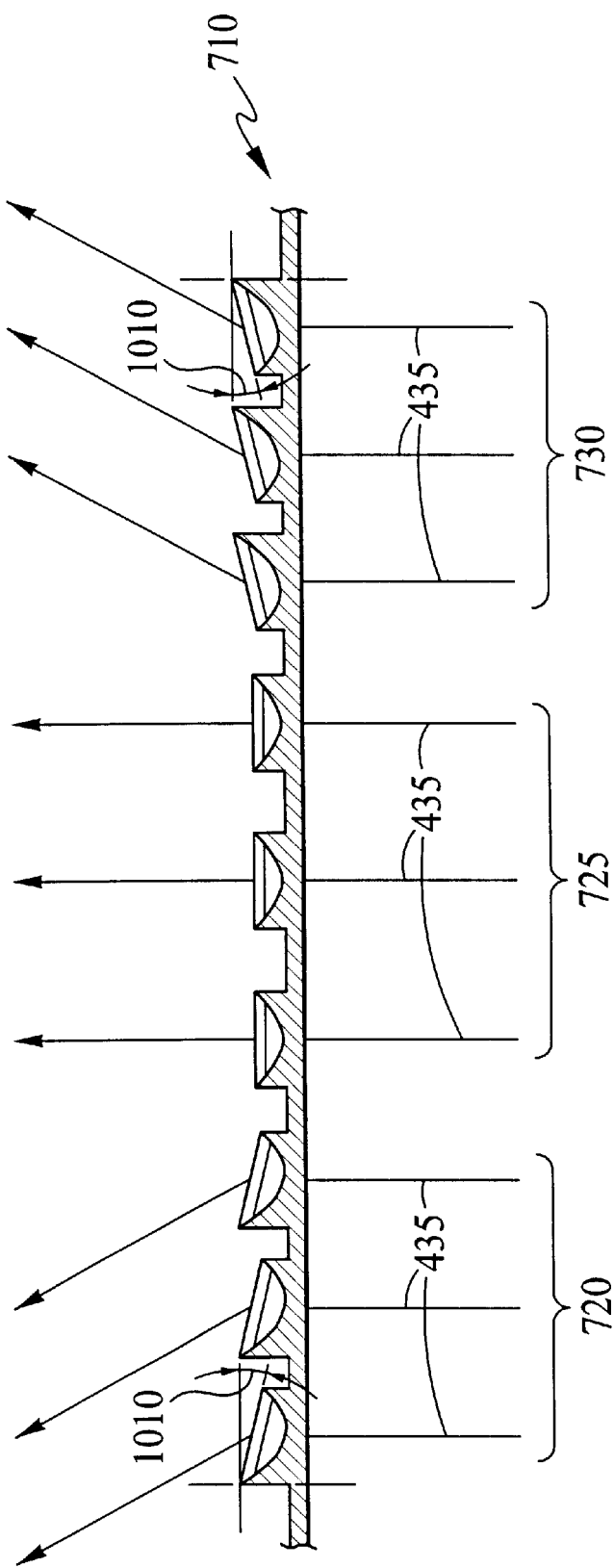
FIG. 10 shows detail 10—10 of FIG. 7, illustrating the orientation of a row of fresnel lenses.

Referring now to FIGS. 7, 9, 10, the individual fresnel lenses 400 making up each of lenses 710 and 910 are divided into three roughly vertical bands 720, 725, 730 or 920, 925, 930. These bands are defined by dividing lines 735, 740 or 935, 940. Each fresnel lens 400 of each band has an orientation determined by its band membership. The orientation of a fresnel lens 400 can be described by an angle lying in the plane formed by the optical axis 435 of an LED 115 and the horizontal axis of the signal module perpendicular to the LED's optical axis 435. The fresnel lenses of the center bands 725, 925 are aligned parallel to the x-y plane and are perpendicular to the optical axis of their LEDs. The fresnel lenses of outer left bands 720, 920 are at an angle 1010 of, for example, eight degrees so as to be slanted rightward toward the center axis of the signal module. In a like manner, the fresnel lenses of outer right bands 730, 930 are at an angle 1010 of, for example, eight degrees and are slanted leftward toward the center axis of the signal module. The angling of the outer band fresnels is designed to concentrate a greater measure of emitted light at the right and left peripheries of the signal. FIG. 10, in particular, is a detail of view 10—10 of FIG. 7 illustrating from a top view the orientation of a row of fresnel lenses as determined by their row, and also their effect upon the direction of light propagation.

Figure 6:
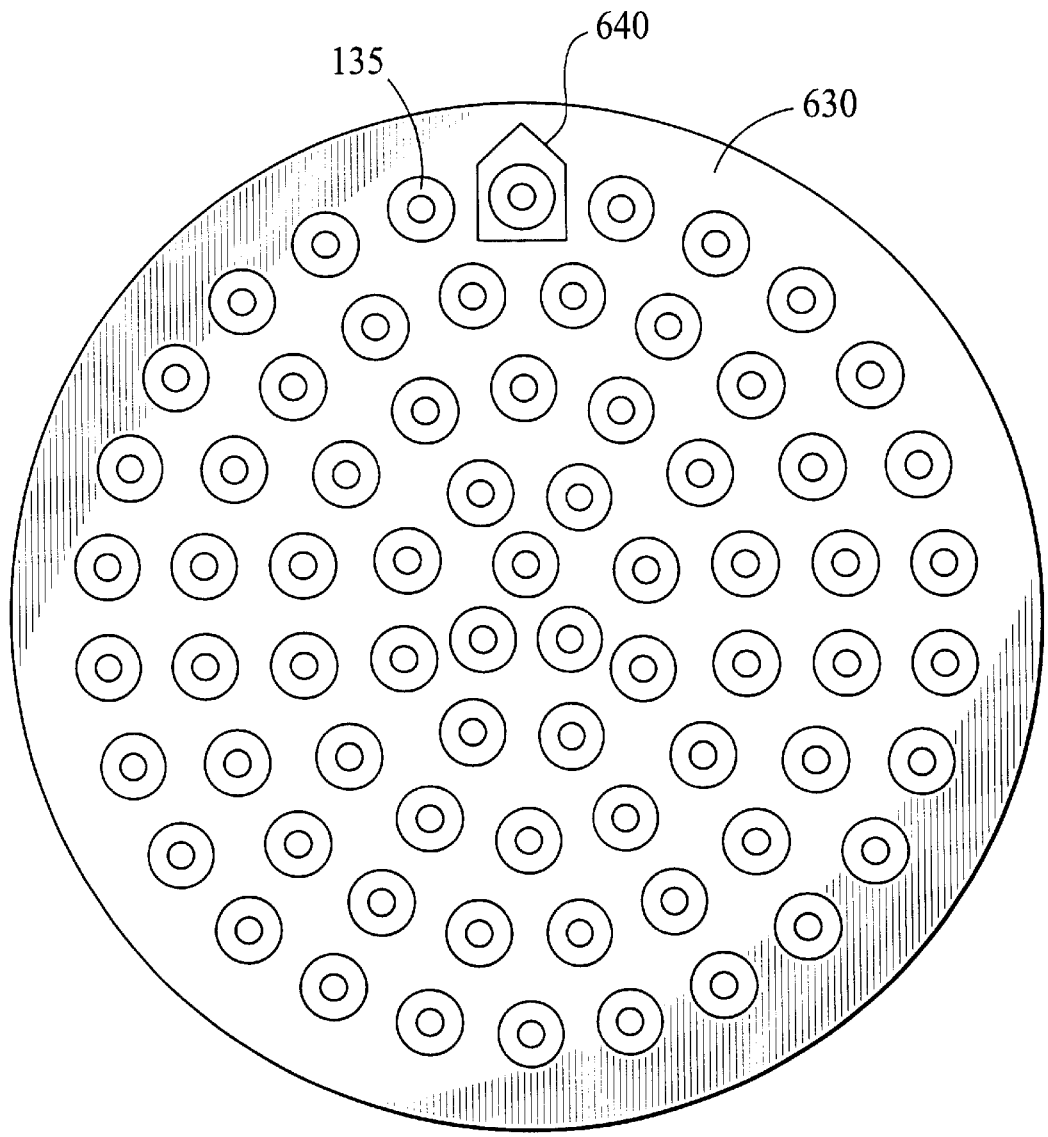
FIG. 6 shows the distribution of the 72 reflectors of an eight inch round overhead signal.
Figure 8:
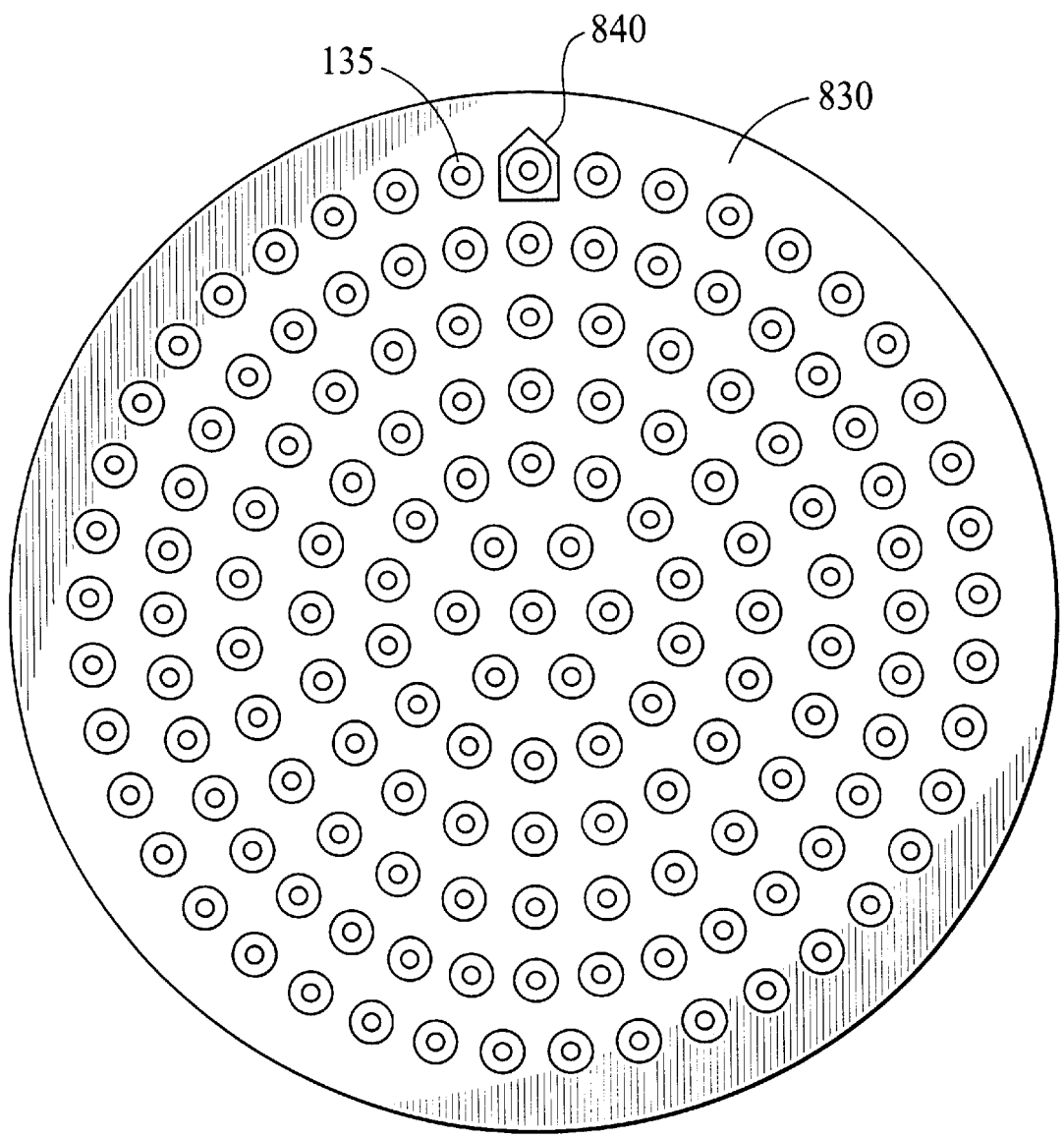
FIG. 8 shows the distribution of the 144 LEDs of a twelve inch round overhead signal.

Two implementations of the signal modules are an eight inch diameter implementation and a twelve inch diameter implementation. The reflector assemblies for these implementations are illustrated, respectively, in FIGS. 6 and 8. The eight-inch reflector assembly 630 has an array of 72 reflectors 135 which are distributed in symmetrical and generally uniform fashion, while the twelve-inch reflector assembly 830 has a symmetrical and generally uniform array of 144 reflectors 135.

Referring to FIGS. 7 and 9, the compound lens 710 (FIG. 7) for the eight-inch module and the compound lens 910 (FIG. 9) for the twelve-inch module are constructed to provide each LED 115 with a fresnel lens 400 centered upon its optical axis 435. Due to the optical characteristics of the fresnel lenses, the module lenses 710, 910 have a top and a bottom and must be mounted accordingly for proper operation. In this regard, each of the lenses 710, 910 includes a mounting indicia 715, 915 identifying the top of the lens and which match similar mounting indicia 640, 840 found at the top of reflector assemblies 630, 830.

Other embodiments are within the scope of the following claims. For example, the signal light module may be implemented as a pedestrian walk/don't walk signal, a turn arrow signal, or a railroad crossing signal.

What is claimed is:

1. A signal light module comprising:

a casing defining a cavity;

an array of LEDs positioned in the cavity;

individual reflectors positioned around individual LEDs of the array of LEDs, the individual reflectors being structured to receive direct light from their associated individual LEDs and substantially to prevent direct light from their associated individual LEDs from impinging upon the individual reflectors of other LEDs of the array of LEDs; and a lens covering the cavity and shaped to concentrate the output luminance of the LEDs below a horizontal axis of the module.

2. The module of claim 1, wherein the lens is clear and the LEDs are operable to emit light having a desired signal color.

3. The module of claim 1, wherein the individual reflectors comprise conic reflectors.

4. The module of claim 1, wherein the individual reflectors comprise parabolic reflectors.

5. The module of claim 1, wherein the individual reflectors are formed as parts of an insert which fits over the LED array and includes holes sized and positioned to integrate each LED with its corresponding reflector.

6. The module of claim 1, wherein the outer surface of the lens has a flat shape.

7. The module of claim 1, wherein the outer surface of the lens has a dome-shaped curvature.

8. The module of claim 1, wherein the lens includes an inner surface having optical detail necessary to position an individual fresnel lens along an optical axis of each LED.

9. The module of claim 8, wherein a fresnel lens comprises three facets, two in an upper region of the lens and one in a lower region of the lens, the upper region being configured to refract upward moving light downward below the horizontal axis, and the lower region being configured to refract light passing through it slightly towards the downward direction.

10. The module of claim 8, wherein the lens has a smooth outer surface.

11. The signal module of claim 1, wherein the lens has a diameter of about eight inches and the module includes less than 80 LEDs.

12. The signal module of claim 1, wherein the lens has a diameter of about twelve inches and the module includes less than 160 LEDs.

13. A traffic light including one or more of the modules of claim 1.

14. The traffic light of claim 13, wherein a module lens includes an inner surface having optical detail necessary to position an individual fresnel lens along an optical axis of each LED.

15. The traffic light of claim 14, wherein a fresnel lens comprises three facets, two in an upper region of the lens and one in a lower region of the lens, the upper region being configured to refract upward moving light downward below the horizontal axis, and the lower region being configured to have a neutral effect upon the direction of light propagating through it.

16. The traffic light of claim 14, wherein a lens has a smooth outer surface.

17. A method of making a signal light module, the method comprising:

positioning an array of LEDs in a casing;

positioning individual reflectors around individual LEDs of the array, the individual reflectors being structured to receive direct light from their associated individual LEDs and substantially to prevent direct light from their associated individual LEDs from impinging upon the individual reflectors of other LEDs of the array of LEDs; and covering the cavity with a lens, the lens being shaped to produce a signal concentrated below a horizontal plane in which the signal module lies and providing generally uniform luminosity when viewed from below the horizontal plane.

* * * * *